(12) United States Patent
Wu

(10) Patent No.: US 6,219,256 B1
(45) Date of Patent: Apr. 17, 2001

(54) CARD ADAPTER INTERFACING BETWEEN A CARD CONNECTOR AND A MEMORY CARD

(75) Inventor: Kun-Tsan Wu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/122,170

(22) Filed: Jul. 24, 1998

(30) Foreign Application Priority Data

Oct. 21, 1997 (TW) .................................................. 86217899

(51) Int. Cl.[7] .............................. H05K 7/14; H01R 13/00
(52) U.S. Cl. .......................... 361/801; 361/759; 439/945
(58) Field of Search .................................... 361/786, 728, 361/736, 737, 756, 797, 801, 802, 816; 439/64, 61, 492, 945, 946; 455/90

(56) References Cited

U.S. PATENT DOCUMENTS

| | | | | |
|---|---|---|---|---|
| 4,858,070 | * | 8/1989 | Buron et al. ......................... | 361/695 |
| 5,155,663 | * | 10/1992 | Harase ................................. | 361/684 |
| 5,513,074 | * | 4/1996 | Ainsbury et al. .................... | 361/737 |
| 5,608,607 | * | 3/1997 | Dittmer ............................... | 361/686 |
| 5,712,766 | * | 1/1998 | Feldman .............................. | 361/737 |
| 5,716,221 | * | 2/1998 | Kanter ............................. | 361/737 X |
| 5,752,857 | * | 5/1998 | Knights ............................... | 439/638 |
| 6,050,848 | * | 4/2000 | Yao ..................................... | 439/483 |

FOREIGN PATENT DOCUMENTS

| | | | |
|---|---|---|---|
| 7-141114 | * | 11/1993 | (JP) . |
| 7-239923 | * | 3/1994 | (JP) . |
| 11-3405 | * | 6/1997 | (JP) . |

\* cited by examiner

*Primary Examiner*—Jayprakash N. Gandhi
(74) *Attorney, Agent, or Firm*—Wei Te Chung

(57) ABSTRACT

A card adapter for interface between a card connector and a memory card comprises a U-shaped structure having a contour adapted to be received in the card connector and comprises an intermediate portion from distal ends of which two side portions extend thereby defining a reception space bound by an inner U-shaped wall of the U-shaped structure for receiving the memory card therein.

10 Claims, 5 Drawing Sheets

CARD ADAPTER INTERFACING BETWEEN A CARD CONNECTOR AND A MEMORY CARD

BACKGROUND OF THE INVENTION

1. Field of the Invention

The present invention relates to a card adapter for receiving a memory card whereby the memory card can be electrically connected to a card connector which was originally only suitable for a memory card of a larger size.

2. The Prior Art

Memory cards have become popular due to the trend of the computer industry toward compact size, modularization, and object oriented requirements, therefore there are many different sized memory cards serving different purposes. However, different sized memory cards cannot simultaneously meet the specific size of a PCMCIA connector, therefore only some memory cards are compatible with the PCMCIA connector while others are excluded therefrom. As observed, many existing memory cards have a size smaller than the reception space of the PCMCIA connector therefore it is requisite to provide an interface means by which memory cards of smaller size can be used with the PCMCIA connector.

SUMMARY OF THE INVENTION

The primary objective of the present invention is to provide a card adapter adapted to be engaged between a memory card having a small size and a card connector having a larger reception space for directly receiving the memory card.

In accordance with one aspect of the present invention, a card adapter for interfacing between a card connector and a memory card comprises a U-shaped structure having a contour adapted to be received in the card connector and comprising an intermediate portion from distal ends of which two side portions extend thereby defining a reception space bound by an inner U-shaped wall of the U-shaped structure for receiving the memory card therein.

These and additional objects, features and advantages of the present invention will become apparent after reading the following detailed description of the preferred embodiment of the invention taken in conjunction with the appended drawing figures.

DETAILED DESCRIPTION OF THE PREFERRED EMBODIMENTS

Figure 1:
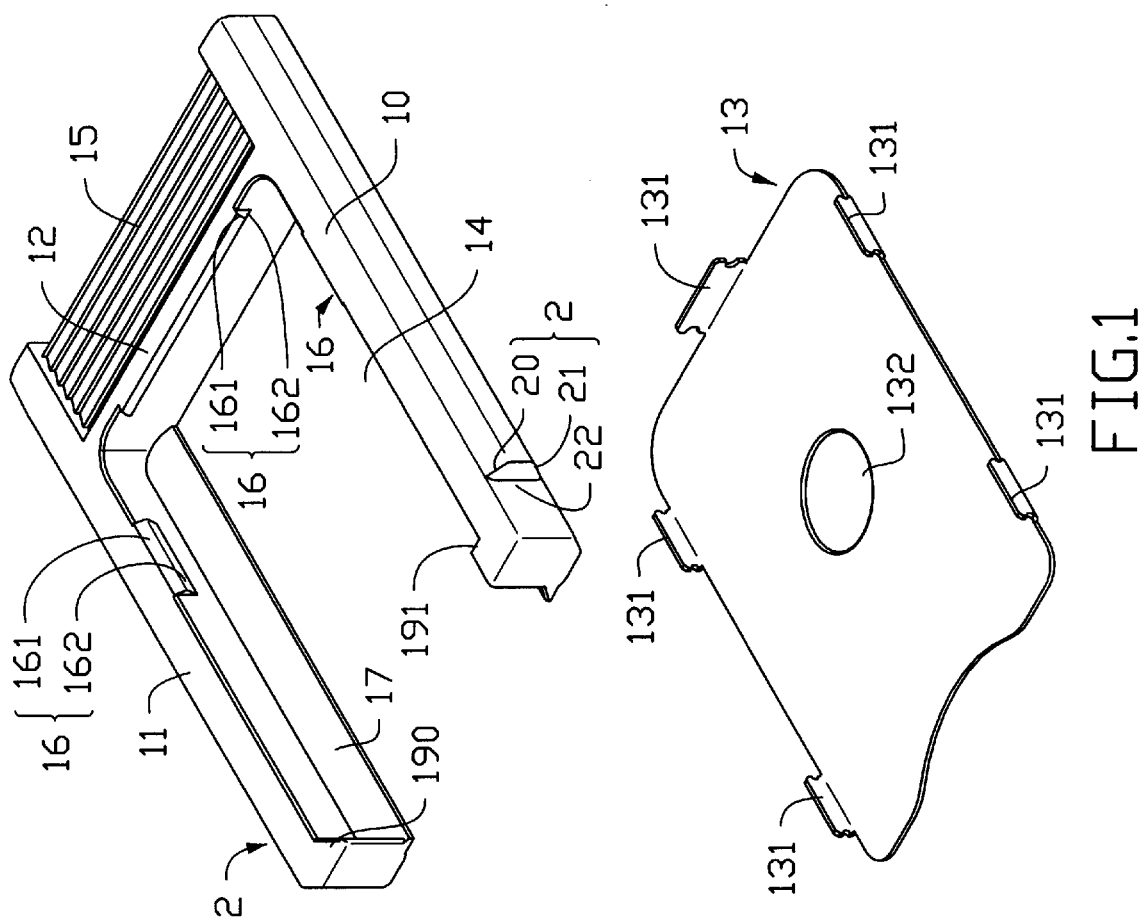
FIG. 1 is an exploded view of a card adapter in accordance with the present invention.
Figure 3:
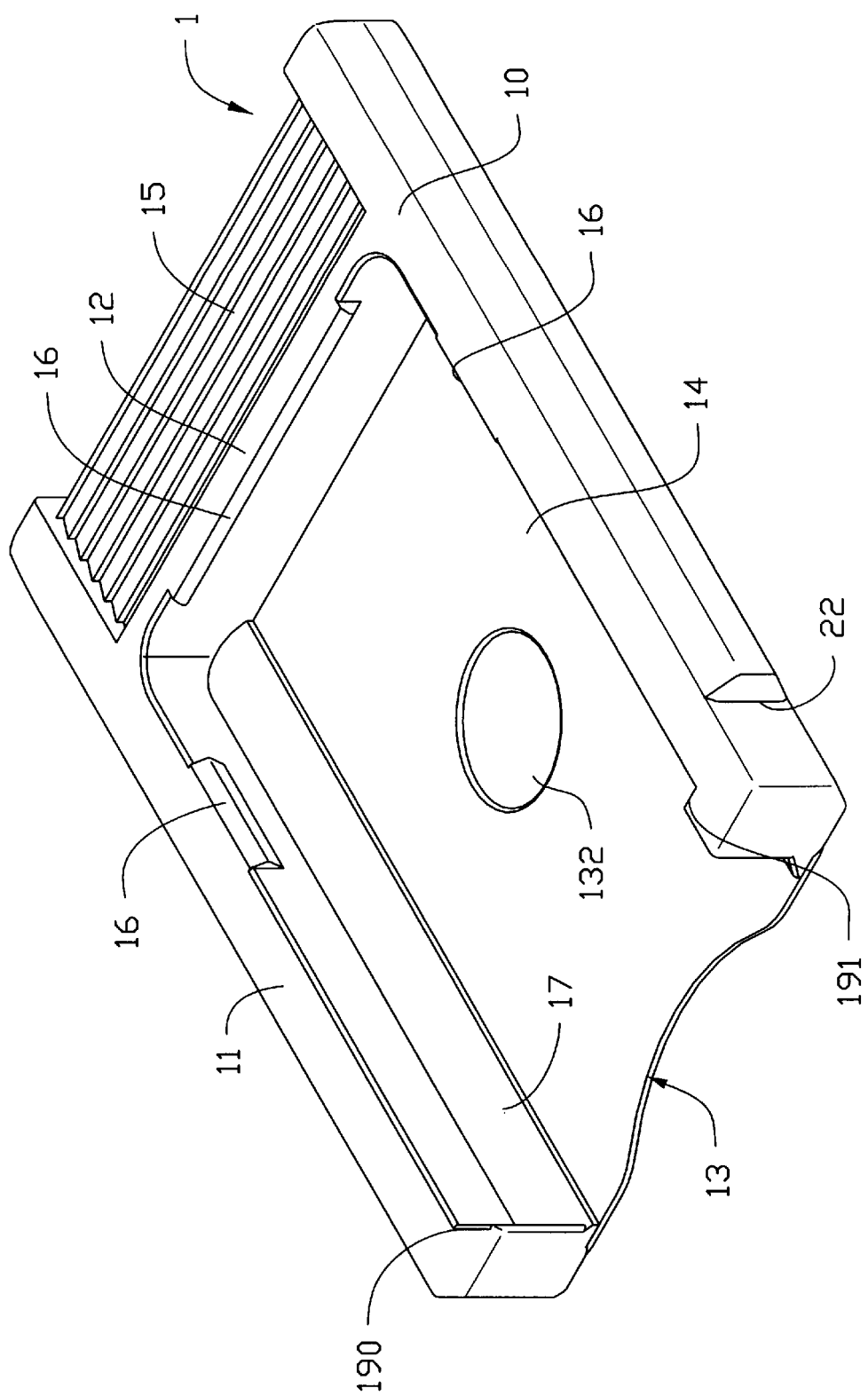
FIG. 3 is another perspective view taken from another angle for more clearly showing the structure of the card adapter of FIG. 2.
Figure 4:
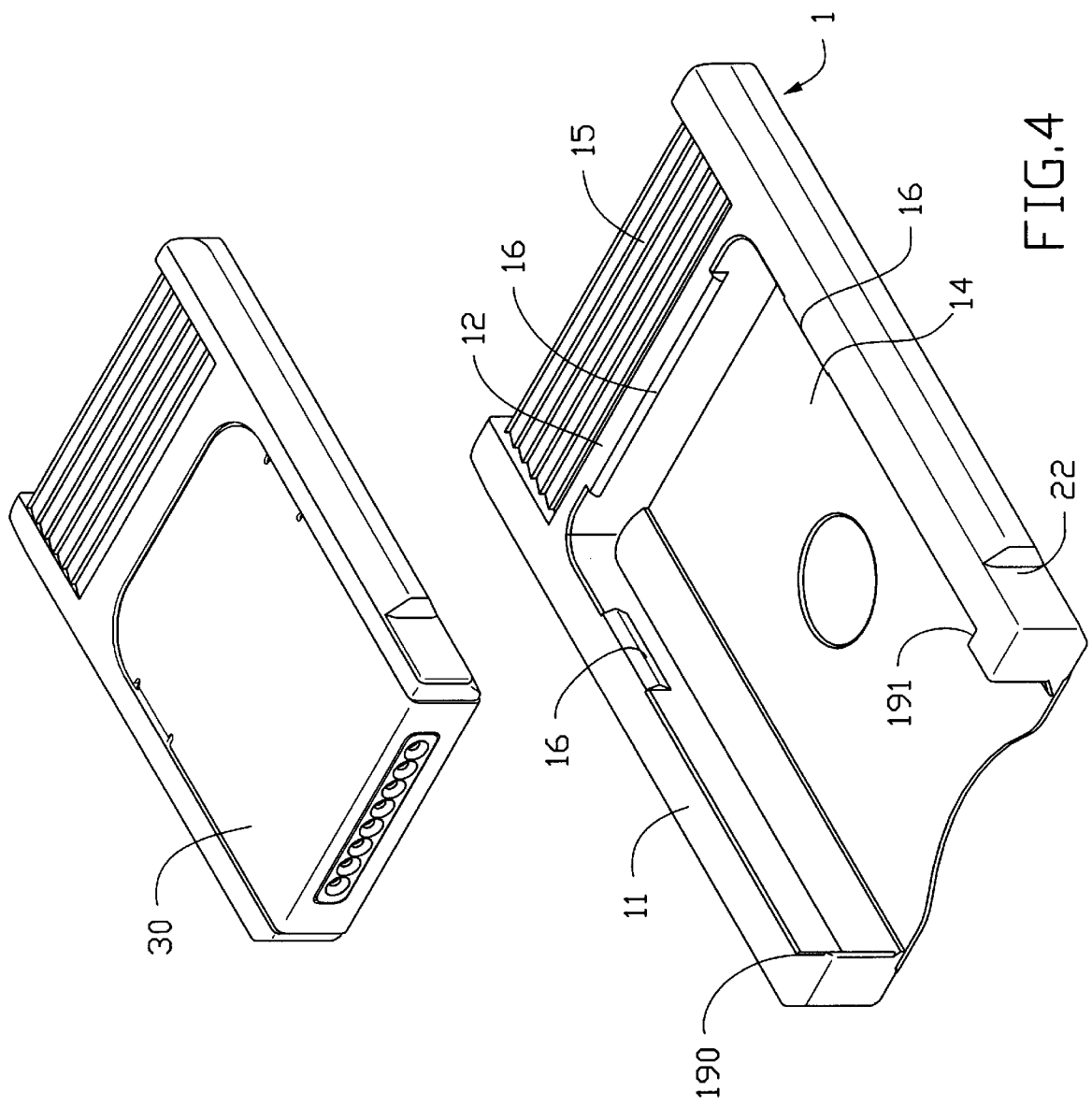
FIG. 4 is an exploded view showing the adapter of FIG. 3 and a memory card to be received in the card adapter.

Referring to the drawings and initially to FIGS. 1, 3 and 4, a card adapter 1 in accordance with the present invention is used as an interface between a memory card 30 and a card connector (not shown) which has a larger size, for directly retaining the memory card 30 therein. The card adapter 1 comprises a U-shaped structure having a contour adapted to be received in the card connector and comprising an intermediate portion 12 defining two ends from which two side portions 10, 11 extend thereby defining a reception space 14 bound by an inner U-shaped wall of the U-shaped structure for receiving the memory card 30 therein. The inner U-shaped wall includes the inner wall portions of the intermediate portion 12 and the side portions 10, 11. The intermediate portion 12 of the card adapter 1 includes a plurality of protrusions 15 formed in opposite faces thereof for generating friction to facilitate manual insertion of the card adapter 1 into the card connector.

Two flanges 17 extend laterally and inwardly from inner confronting wall portions of the side portions 10, 11 for supporting the memory card 30. An engaging member 16 respectively projects from each of the inner wall portions of the intermediate portion 12 and the side portions 10, 11 for cooperating with the flanges 17 to fix the memory card 30 therebetween. Each engaging member 16 is a triangular body extending from the corresponding inner wall of the U-shaped structure and having an upper face 161 connected to a lower face 162 wherein the memory card 30 is manually operated to slide past the upper face 161 of each engaging member 16 thereby becoming engaged between the flanges 17 and the lower faces 162 of the triangular bodies 16. Herein, the upper face 161 and the lower face 162 may be connected at an obtuse angle or a curved angle. Each side portion 10, 11 of the U-shaped structure has a stop 190, 191 extending laterally and inwardly from a free end thereof for preventing the memory card 30 from exiting laterally from the opening of the inner U-shaped wall.

Each side portion 10, 11 of the U-shaped structure has a protrusion 2 extending from an outer wall thereof. The protrusion 2 has asymmetric tapered faces 20, 21 and a top face (not labeled) connected therebetween for preventing improper orientation of the card adapter 1 during insertion into the card connector.

Figure 2:
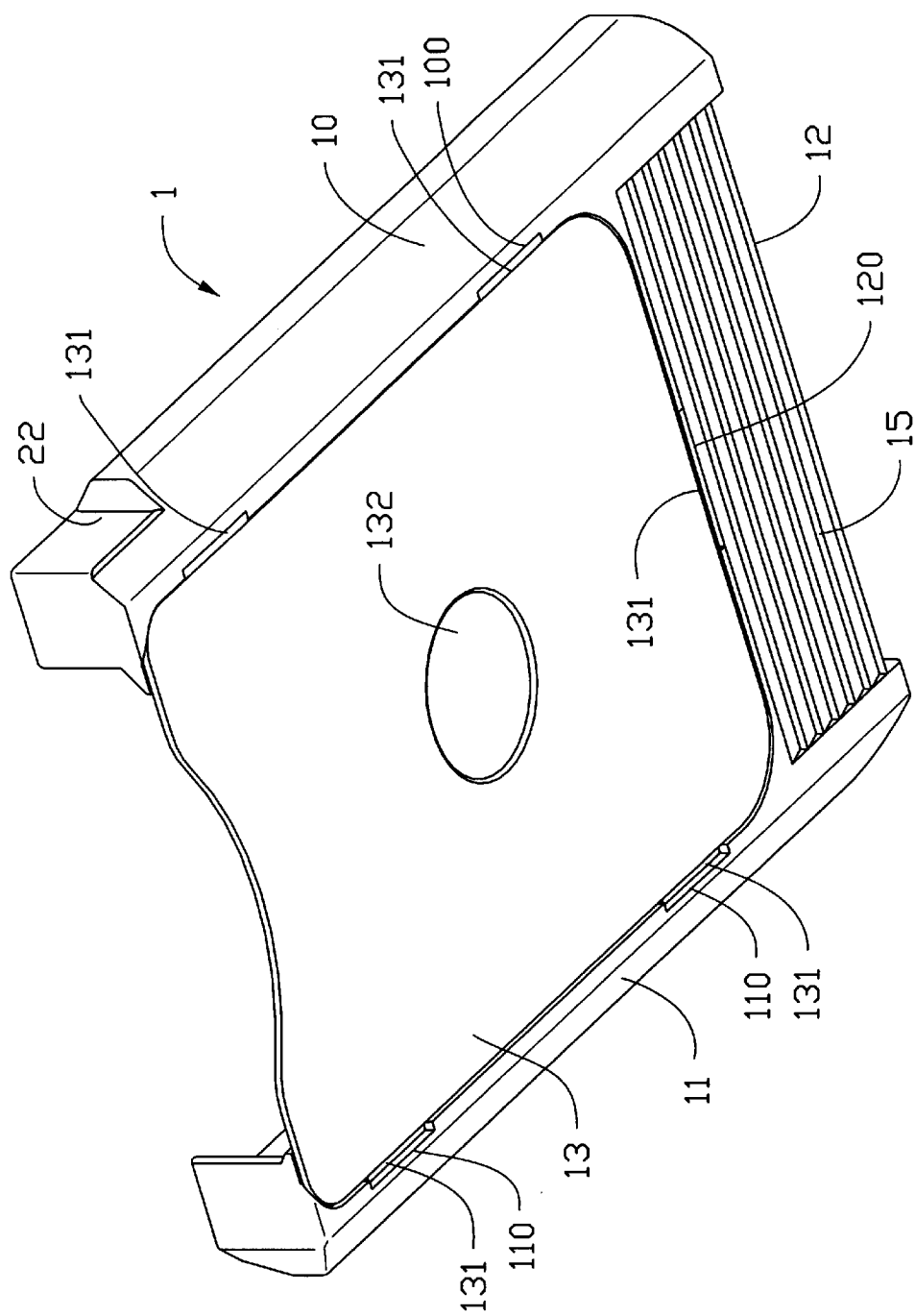
FIG. 2 is an assembled view of FIG. 1.
Figure 5:
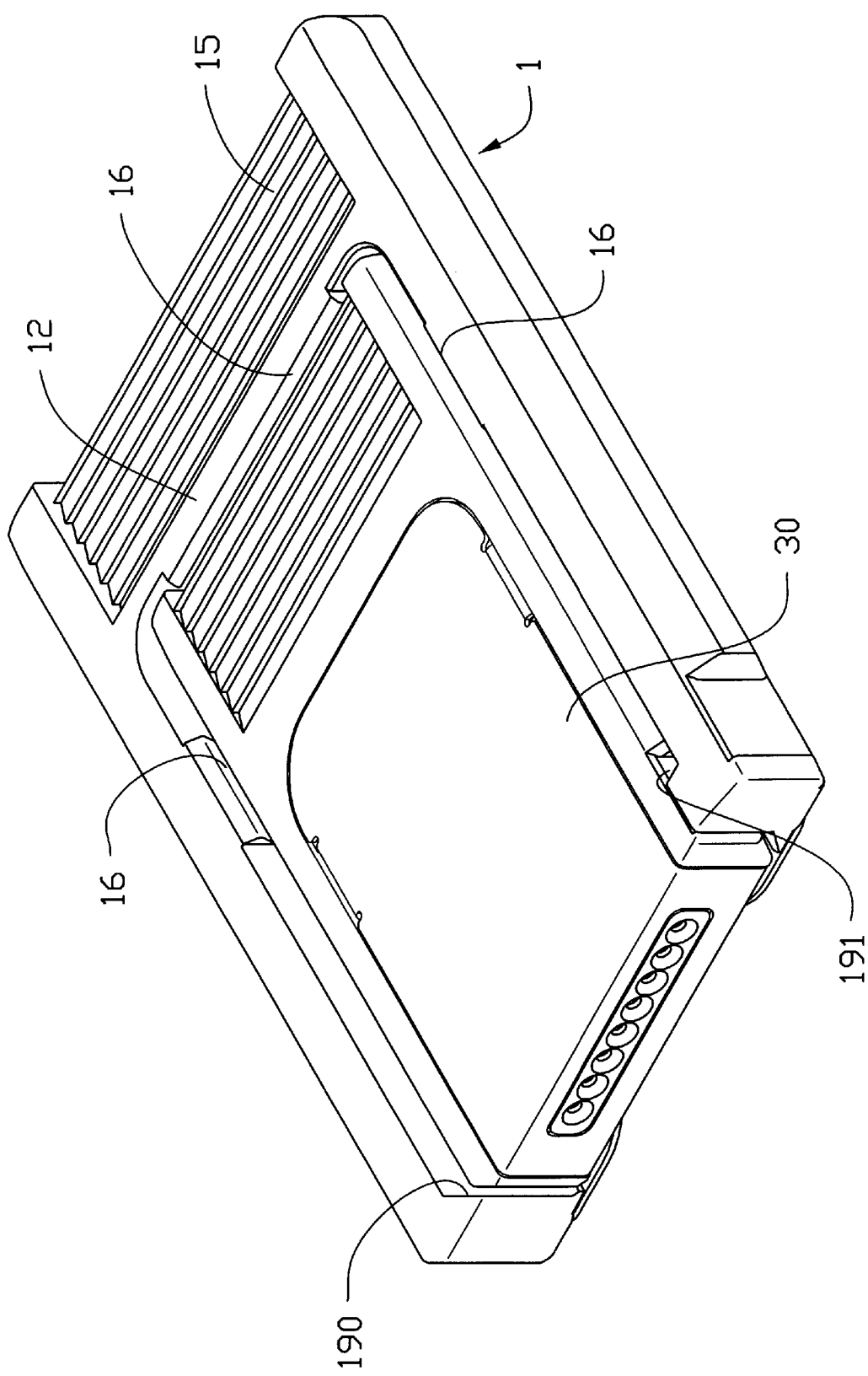
FIG. 5 is an assembled view of FIG. 4.

The protrusion 2 extends partially from the outer wall of each side portion 10, 11 of the U-shaped structure 1 thus forming a step structure 22 between a free end of the protrusion 2 and a free end of the side portion 10, 11 for abutting against an inner protrusion (not shown) of the card connector. A shielding 13 is adapted to be engaged with the U-shaped structure and attached under the memory card 30 for suppressing noise interference from acting on the memory card 30. Specifically, the shielding 13 has tabs 131 extending from three sides thereof for engagement with recesses 100, 110, and 120 respectively defined in a bottom wall of the side portions 10, 11 and the intermediate portion 12 as shown in FIG. 2. The memory card 30 can be manually positioned into the reception space 14 of the card adapter 1 from a top position thereof as shown in FIG. 5. The shielding 13 defines at least a hole 132 therein allowing for manual ejection of the memory card 30 from the card adapter 1.

While the present invention has been described with reference to specific embodiment, the description is illustrative of the invention and is not to be construed as limiting the invention.

Therefore, various modifications to the present invention can be made to the preferred embodiment by those skilled in the art without departing from the true spirit and scope of the invention as defined by the appended claims.

What is claimed is:

1. A card adapter for interfacing between a card connector and a memory card, the card adapter comprising a U-shaped structure having a contour adapted to be received in the card connector and comprising an intermediate portion from distal ends of which two side portions extend thereby defining a reception space bound by an inner U-shaped wall of the U-shaped structure for receiving the memory card therein; wherein two flanges extend from confronting portions of the inner U-shaped wall for supporting the memory card; wherein at least one engaging member projects from confronting portions of the inner U-shaped wall for cooperating with the flange to fix the memory card therebetween; wherein at least of one the side portions of the U-shaped structure has a stop extending laterally and inwardly from a free end thereof for preventing the memory card from exiting laterally from the inner U-shaped wall.

2. The card adapter as claimed in claim 1, wherein the intermediate portion of the card adapter includes a plurality of protrusions formed on opposite faces thereof.

3. The card adapter as claimed in claim 1, wherein the engaging member is a triangular body extending from the U-shaped inner wall and having an upper face connected to a lower face wherein the memory card is manually operated to slide past the upper face thereby becoming engaged between the flanges and the lower face of the triangular body.

4. The card adapter as claimed in claim 1, wherein each side portion of the U-shaped structure has a protrusion extending from an outer wall thereof and the protrusion has at least a tapered face for preventing improper orientation of the card adapter during insertion into the card connector.

5. The card adapter as claimed in claim 4, wherein the protrusion extends partially from the outer wall of the side portion of the U-shaped structure thus forming a step structure between a free end of the protrusion and a free end of the side portion for abutting against an inner protrusion of the card connector.

6. The card adapter as claimed in claim 5 further comprising a shielding adapted to be engaged with the U-shaped structure and attached under the memory card for suppressing noise interference from acting on the memory card.

7. The card adapter as claimed in claim 6, wherein the shielding defines at least a hole thereby allowing for manual ejection of the memory card from the card adapter.

8. An assembly for use with a memory card connector, comprising:

an adapter including a U-shaped structure defined by an intermediate portion and two opposite side portions so as to form a lateral opening opposite to said intermediate portion;

a small sized memory card, which is not fit for the connector, being adapted to be snugly fit within a space formed by said U-shaped structure wherein a connection portion of the memory card is positioned adjacent to the lateral opening and exposed to an exterior through said opening; wherein said intermediate portion is far away opposite to said connection portion of the memory card.

9. The assembly as claimed in claim 8, wherein said intermediate portion defines means for facilitating manual insertion of the assembly into the memory card connector.

10. An assembly for use with a memory card connector, comprising:

an adapter including a U-shaped structure defined by an intermediate portion and two opposite side portions so as to form a lateral opening opposite to said intermediate portion;

a small sized memory card, which is not fit for the connector, being adapted to be snugly fit within a space formed by said U-shaped structure wherein a connection portion of the memory card is positioned adjacent to the lateral opening and exposed to an exterior through said opening; wherein said small sized memory card is installed into the space in a vertical direction relative to the adapter, and said U-shaped structure defines a stop extending laterally and inwardly around said opening and preventing the memory card from exiting laterally from the adapter.

* * * * *